United States Patent [19]
Farrow

[11] Patent Number: 5,963,594
[45] Date of Patent: Oct. 5, 1999

[54] VECTOR TRACKING FILTER

[75] Inventor: Cecil William Farrow, Highlands, N.J.

[73] Assignee: Lucent Technologies Inc., Murray Hill, N.J.

[21] Appl. No.: 08/777,889

[22] Filed: Dec. 31, 1996

[51] Int. Cl.$^6$ ........................................................ H03H 7/30
[52] U.S. Cl. .......................... 375/235; 375/229; 375/350; 364/724.19
[58] Field of Search ........................... 364/724.19, 724.2; 375/229, 235, 350

[56] References Cited

U.S. PATENT DOCUMENTS

| | | | |
|---|---|---|---|
| 4,985,900 | 1/1991 | Rhind et al. | 375/10 |
| 5,491,725 | 2/1996 | White | 375/324 |
| 5,499,268 | 3/1996 | Takahashi | 375/231 |
| 5,504,785 | 4/1996 | Becker et al. | 375/344 |
| 5,586,068 | 12/1996 | Rakib | 364/724.16 |
| 5,602,765 | 2/1997 | Tanaka et al. | 364/724.19 |
| 5,612,975 | 3/1997 | Becker et al. | 375/319 |
| 5,621,766 | 4/1997 | Bakke et al. | 375/340 |
| 5,677,932 | 10/1997 | Comte et al. | 375/235 |

Primary Examiner—Ayaz R. Sheikh
Assistant Examiner—Tim T. Vo
Attorney, Agent, or Firm—Thomas Stafford

[57] ABSTRACT

A new filter that may be employed in timing recovery circuits, and automatic gain control circuits, employs a so-called vector tracking filter (VTF). The VTF includes a complex filter with a time constant so long that it might be considered a leaky integrator. In operation, the VTF builds up an average vector (timing (gain) estimate vector) having a direction that is the average of the estimated timing (gain) error, which is stored in the VTF. When the VTF is employed in an automatic gain control arrangement, the vector becomes a scalor and only the amplitude is tracked. When an arbitrary timing (gain) correction is made, to the incoming signal, this causes a rotation of the timing (gain) estimate vector. In order to track this rotation, a comparable rotation is made to the stored timing (gain) estimate vector. This allows the stored timing (gain) estimate vector to build up, and at any time the stored timing (gain) estimate vector will be the same as if the current incoming phase had been constant for all previous time. Consequently, it is possible to use a very long time constant in the VTF for long-term steady timing (gain) and at the same time acquire timing (gain) fast. In one example, the length of the vector stored in the VTF is allowed to build up until it reaches the mean value of the incoming timing (gain) estimate.

5 Claims, 3 Drawing Sheets

VECTOR TRACKING FILTER

RELATED APPLICATION

U.S. Pat. application Ser. No. (C.W. Farrow Case 30) was filed concurrently herewith.

TECHNICAL FIELD

This invention relates to filter arrangements and, more particularly, to filters for use in timing recovery circuits, automatic gain control circuits or other arrangements that require tracking of data signals or the like.

BACKGROUND OF THE INVENTION

Filters that have been used in prior timing recovery circuits, automatic gain control circuits or the like, retained some memory of the past timing or gain error estimates. Such prior filters inevitably slow down the tracking of the timing or gain, or have so broad a band width as to allow the recovered timing (gain) to have considerable jitter. Indeed, in order to recover timing and the like from data signals with very low signal-to noise-ratio (SNR) it is necessary to do some narrow band filtering. This narrow band filtering is in conflict with a fast acquisition time. Attempts at overcoming these problems, typically employed a filter that used a so-called "gearshift" which after some initial start-up interval shifted the filter time constant from short, fast and noisy to long, slow and quiet. Use of such gearshift filters is undesirable because a significantly long time is required before the time constant shift is effected. Consequently, fast acquisition was compromised.

SUMMARY OF THE INVENTION

The problems and limitations of prior known filters employed in timing recovery circuits, automatic gain control circuits and the like, are overcome by employing a so-called vector tracking filter (VTF). The VTF includes a complex filter with a time constant so long that it might be considered a leaky integrator. In operation, the VTF builds up an average vector (timing (gain) estimate vector) having a direction that is the average of the estimated timing (gain) error, which is stored in the VTF. When the VTF is employed in an automatic gain control arrangement, the vector becomes a scalor and only the amplitude is tracked. When an arbitrary timing (gain) correction is made, to the incoming signal, this causes a rotation of the timing (gain) estimate vector. In order to track this rotation, a comparable rotation is made to the stored timing (gain) estimate vector. This allows the stored timing (gain) estimate vector to build up, and at any time the stored timing (gain) estimate vector will be the same as if the current incoming phase (amplitude) had been constant for all previous time. Consequently, it is possible to use a very long time constant in the VTF for long-term steady timing (gain) and at the same time acquire timing (gain) fast. In one example, the length of the vector stored in the VTF is allowed to build up until it reaches the mean value of the incoming timing (gain) estimate.

An advantage of using the VTF is that no gear shifting is required and fast acquisition is realized while employing a long time constant.

DETAILED DESCRIPTION

Figure 1:
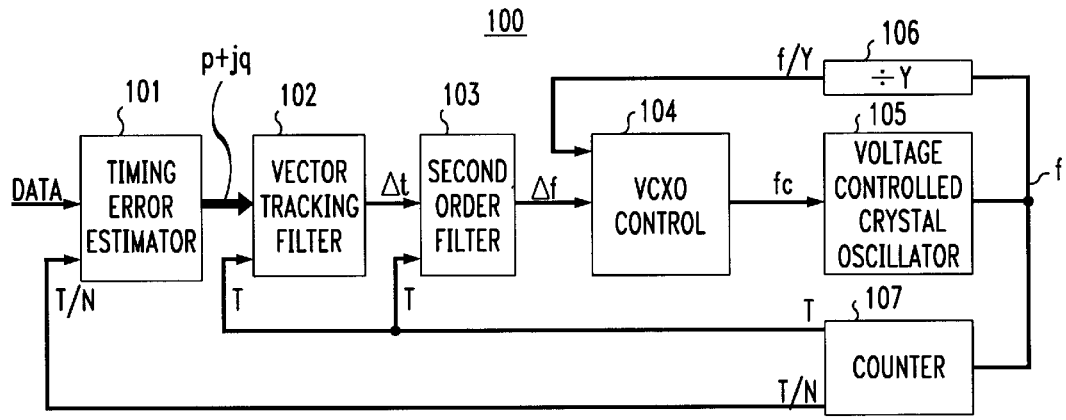
FIG. 1 shows in simplified block diagram form a timing recovery arrangement employing a VTF in accordance with the invention.
Figure 2:
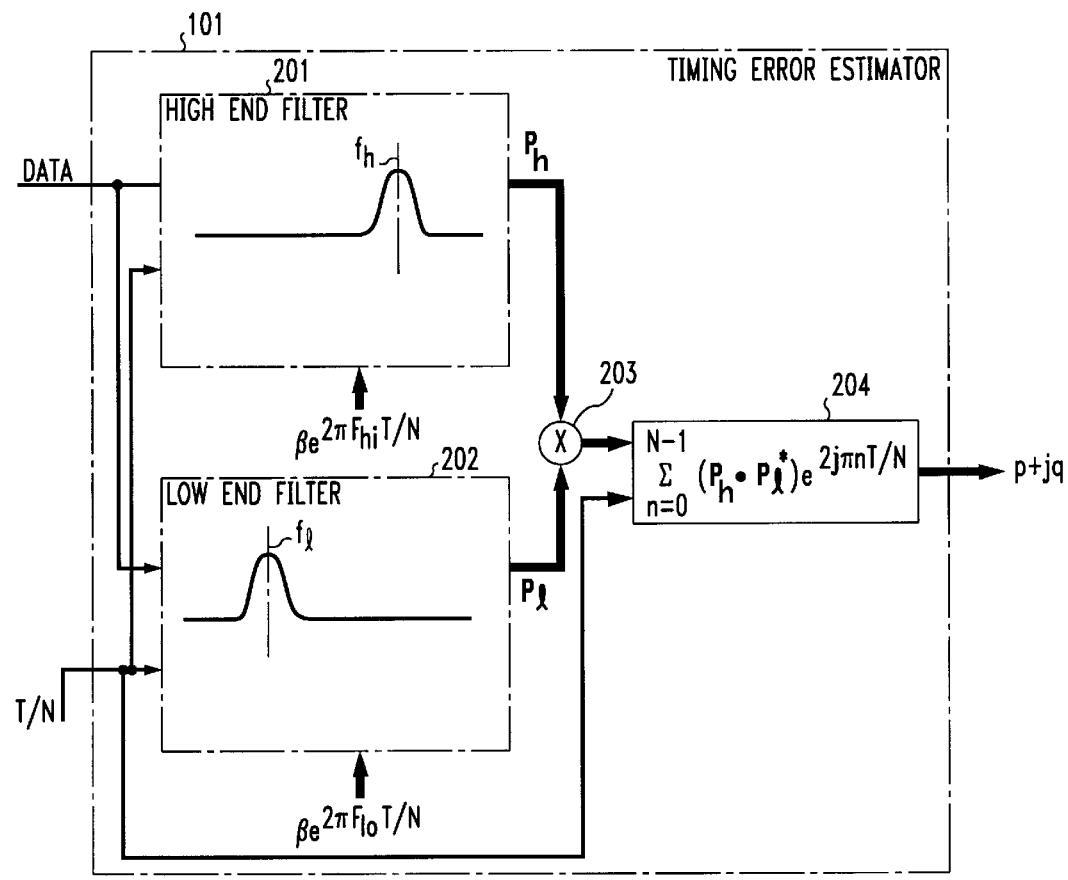
FIG. 2 shows in simplified block diagram form the timing error estimator employed in FIG. 1.
Figure 3:
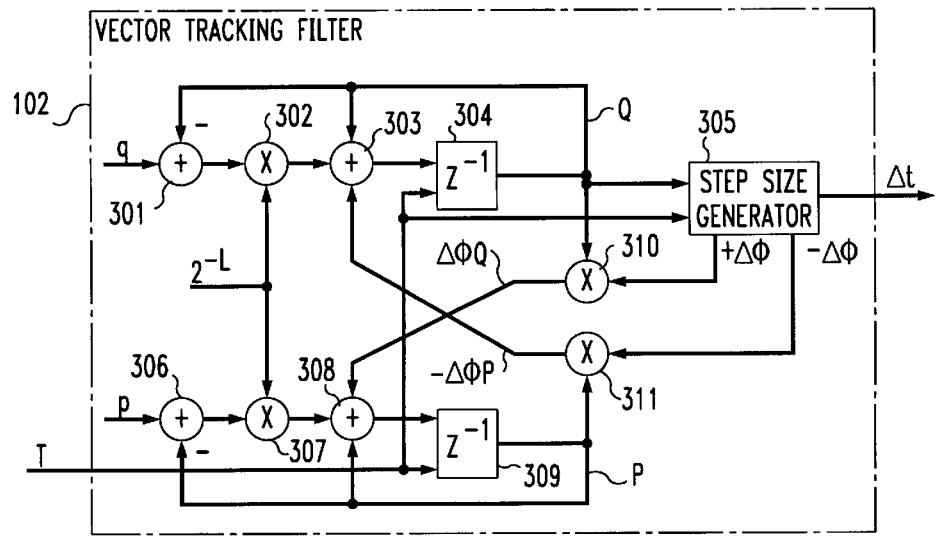
FIG. 3 shows in basic form a VTF in accordance with the invention which is employed in FIG. 1.
Figure 6:
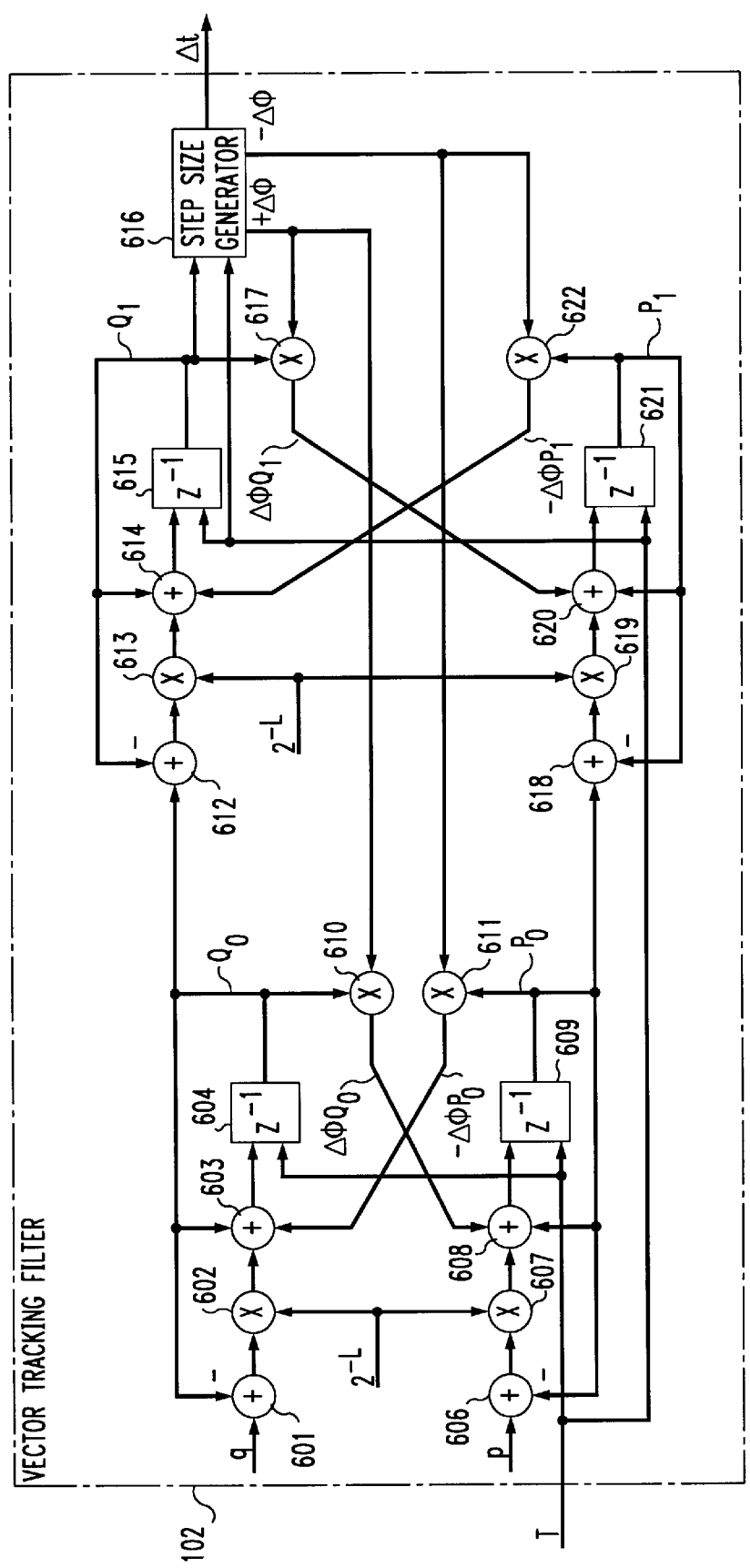
FIG. 6 shows in simplified form a two (2) stage VTF in accordance with the invention.

FIG. 1 shows in simplified block diagram form timing recovery arrangement 100 which includes, in this example, timing error estimator 101, VTF 102, second order filter 103, voltage controlled crystal oscillator (VCXO) control 104, voltage control crystal oscillator (VCXO) 105, divider 106 and counter 107. Note that although a VCXO is employed in this example, other oscillator arrangements may equally be employed. Such arrangements include, but are not limited to, a voltage controlled oscillator (VCO), a digital interpolator (see for example my U.S. Pat. No. 4,866,647), add-delete arrangements or the like. As shown, a data signal (DATA) and a first clock signal (T/N) are supplied to timing error estimator 101. The data signal is one of a broad class of such data signals including, but not limited to, QAM, CAP, and the like. It should be noted that in high order QAM, as in 64 QAM, with very low excess bandwidth the timing information is weak and, therefore, the information is going to be very noisy. The first clock signal T/N is supplied from counter 107 and will be described below. An example of timing estimator 101 is shown in FIG. 2 and will be described in detail below. Timing estimator 101 generates an estimated timing vector p+jq, which is supplied as in input to VTF 102. Also supplied to VTF 102 is a second clock signal (T), typically at the baud rate, from counter 107. Details of one embodiment of VTF 102, in accordance with the invention, are shown in FIG. 3 while a second two stage embodiment is shown in FIG. 6 and described below. VTF 102 internally generates a filtered version of estimated timing vector p+jq, namely, P+jQ, which is utilized internally to generate a change in its representation of a change in step size, namely, Δt. Step size Δt is supplied to second order filter 103 along with second clock signal T. Such second order filters are well known in the art. Second order filter 103 generates an updated version of step size Δt, namely, Δf which is supplied as an input to VCXO control 104. VCXO control 104 is responsive to Δf and to a modified version, namely, f/Y, of the frequency, f, output of voltage controlled crystal oscillator 105. VCXO control 104 generates control signal fc which is supplied as an input for controlling voltage controlled crystal oscillator 105, in known fashion. In turn, voltage controlled crystal oscillator 105 generates timing signal f at a desired frequency. Timing signal f is supplied to divider 106 and to counter 104. Divider 106 simply divides timing signal f by Y to yield signal f/Y. Note that signal f is divided by Y to reduce the speed in VCXO control 104. It should be further noted that Counter 107 is employed, in known fashion, to generate timing signals T and T/N in response to timing signal f.

FIG. 2 shows in simplified block diagram form details of timing error estimator 101 employed in FIG. 1. Although FIG. 2 shows a specific implementation of timing error estimator 101, which can be advantageously employed in the timing recovery arrangement of FIG. 1, it will be apparent to those skilled in the art that other implementations may be equally employed. As shown, the data signal is supplied to timing error estimator 101 and, therein, to a so-called high-end infinite impulse response (IIR) filter 201 and to low-end IIR filter 202. Such IIR filters are known in the art. High-end IIR filter 201 is responsive to the data signal, a predetermined constant $\beta e^{j2\pi F} \text{hi}^{T/N}$ and is driven by first clock signal T/N to yield complex filtered signal $P_h$, at the high band end frequency, as illustrated, where $P_h = p_h + jq_h$. Similarly, low-end IIR filter 202 is responsive to the data signal, a predetermined constant $\beta e^{j2\pi F} \text{lo}^{T/N}$ and is driven by first clock signal T/N to yield complex filtered signal $P_1$, at the low band end frequency as illustrated, where $P_1 = p_1 + jq_1$. Complex filter signals $P_h$ and $P_1$ are supplied to multiplier 203 which yields signal $P_h \cdot P_1^*$. In turn, signal $P_h \cdot P_1^*$ is supplied to averager 204. Averager 204 sums the signal $P_h \cdot P_1^*$ values according to $$\sum_{n=0}^{N-1} (P_h \cdot P_1^*) e^{2j\pi n T/N}$$

to yield N times the average of estimated timing vector p+jq over each symbol of the data signal. Note that p+jq is a complex sample estimate and is supplied to VTF 102.

FIG. 3 shows in simplified form details of one embodiment of VTF 102. The values of the real (p) and imaginary (q) parts of average estimated timing vector p+jq from timing error estimator 101 (FIG. 1) are obtained in well known fashion (not shown). The value of q of the imaginary part is supplied to one input of combining unit 301 and the value of the real part p is supplied to one input of combining unit 306. Output Q from $Z^{-1}$ standard delay unit 304 is supplied to a negative input of combining unit 301, to an input of combining unit 303, to step size generator 305 and to multiplier 310. Similarly, output P from $Z^{-1}$ standard delay unit 309 is supplied to a negative input of combining unit 306, to an input of combining unit 308, and to multiplier 311. Also supplied to multiplier 311 is $-\Delta\phi$ which then yields $-\Delta\phi P$. Constant $2^{-L}$ is supplied to multipliers 302 and 307 to realize exponential smoothing of p and q, respectively. It should be noted that L should be as large as is practical. In one example L is 16. Combining unit 303 combines the output of multiplier 302, output Q from $Z^{-1}$ standard delay unit 304 and output $-\Delta\phi P$ from multiplier 311 to form an input to $Z^{-1}$ standard delay unit 304 in Z transform (of one clock interval) and combining unit 308 combines the output of multiplier 307, output P from $Z^{-1}$ standard delay unit 309 and output $\Delta\phi Q$ from multiplier 310 to form an input to $Z^{-1}$ standard delay unit 309 also in Z transform which, in turn, yields the smoothed values of p and q, namely, P and Q in this example, as indicated by the following relationships:

$$P_n = P_{n-1} + 2^{-L}(p_n - P_{n-1}) \text{ and}$$

$$Q_n = Q_{n-1} + 2^{-L}(q_n - Q_{n-1}), \text{ respectively.}$$

Then, to rotate the P, Q vector, $\Delta\phi$, which in this example is an integral step size, the following relationships are employed in this example:
$P_n = P_{n-1} + \Delta\phi \cdot Q_{n-1}$ and $$Q_n = Q_{n-1} - \Delta\phi \cdot P_{n-1}, \text{ respectively.}$$

The above equations for rotating vector P, Q are so-called small angle approximations. It can be shown that in these approximations the radial and angular errors are $\cong \Delta\phi^2/2$, and $\cong \Delta\phi^3/3$, respectively, in one example. All values of $\Delta\phi$ can be powers of 2 so that all multiplies can be implemented utilizing shifts, thereby making it easier to implement the VTF on VLSI, an ASIC or DSP.

More specifically, in an embodiment of the VTF, the phase of the sampling clock is rotated in such a direction so as to reduce any estimated timing error. The current timing phase is then given by:

$$\phi_n = \phi_{n-1} + \Delta_n.$$

Without vector tracking the filter is updated as follows:

$$X_n = e^{j\varpi\phi} \cdot x_n + \beta X_{n-1} = \sum_k \beta^k \cdot (e^{j\Delta\phi_{n-k}} \cdot x_{n-k}),$$

and with vector tracking, the VTF is updated in accordance with the following:

$$X_n = e^{j\phi_n} \cdot x_n + e^{j\Delta_n} \cdot \beta \cdot X_{n-1} = e^{j\phi_n} \cdot \Sigma \beta \cdot x_{n-k},$$

where $\Delta_n$ is the most current timing update, x=p+jq, X=P+jQ, $0 < \alpha = (1-\beta) << 1$ and the time constant $\cong T/\alpha$.

From the above equations, it can be seen that using vector tracking the filtered result depends only on $\phi_n$ and the independent filter value of x, and is independent of the path taken to arrive there. Thus, if large steps are taken initially, i.e., at start up, they will not affect the filtering. Consequently, relatively fast convergence is obtained initially and a relatively quiet operation of the filter is realized over the long term by the combination of reducing the step size and the fact that the accumulation in the filter also reduces the angular noise.

A representation of Q and timing signal T are supplied to step-size generator 305 which yields $+\Delta\phi$ that is supplied to multiplier 310 and $-\Delta\phi$ which is supplied to multiplier 311. Details of step size generator 305 are described below regarding FIG. 4. Again, it should be noted that in one embodiment all values of $\Delta\phi$ are fractional powers of 2, so that all multipliers can be implemented with shifts which makes it easier to implement the VTF on VLSI, an ASIC (application specific integrated circuit) or DSP (digital signal processor). Additionally, it should be noted that $\Delta\phi$ is in radians and $\Delta t$ is in fractions of the sampling intervals. $\Delta t$ is representative of a control signal which, as indicated above, is supplied to second order filter 103 (FIG. 1) which generates in turn $\Delta f$ for controlling VCXO control 104.

Furthermore, it is important to note that none of the past knowledge is lost. Indeed, once the vector is rotated and the VTF is in the steady state, it appears that the timing vector was at its rotated position all along, i.e., for all past time.

For proportional control of the timing recovery arrangement, we begin with $$\Delta_n = k \cdot Q \cdot W,$$

where $$W = \frac{1}{\sqrt{P^2 + Q^2}}$$

and in one example k=1/64 and $\alpha = 2^{-8}$, i.e., $\Delta_n$ is equal to 1/64 times the SINE of the estimated angular error.

Then, in accordance employing the above noted timing filter updating equations without vector tracking and with vector tracking the incoming timing vector is filtered and a corresponding timing update is generated.

The computation for updating the timing filter without vector tracking lends itself easily for use with a DSP because P and Q are heavily filtered. Then, W can be readily updated as follows $$W_n = W_{n-1} \cdot \{1 - [W^2_{n-1} \cdot (P^2_n + Q^2_n) - 1]\}/2$$

by using "small angle" approximations, i.e., $\cos(x) \approx 1$, $\sin(x) \approx x$, the vector tracking update can be reduced to:

$$P' = P_{n-1} + \alpha \cdot (P_n - P_{n-1})$$

$$Q' = Q_{n-1} + \alpha \cdot (q_n - Q_{n-1})$$

and $$P_n = P' + \Delta_n \cdot Q'$$

$$Q = Q' - \Delta_n \cdot P'$$

Then, using the above reduced vector tracking equations, and making $\alpha$ and $\Delta_n$ powers of 2, it is possible to implement the VTF in silicon, using shifts instead of multiples. In the instance of $\alpha$, in one example a very long time constant, for example $\alpha = 2^{-16}$ may be employed which amounts to a "leaky" integrator. The range of $\Delta_n$ may be, for example, $2^{-12} \leq \Delta_n \geq 2^{-16}$. The value of $\Delta_n$ is changed dynamically by reducing the value of $\Delta_n$ whenever the sign of Q changes, and increasing the value of $\Delta_n$ when the sign of Q stays the same. This would be done in such a way as to favor the small values of $\Delta_n$; thus ensuring in the long-term, timing step sizes will be very small and therefore the timing jitter will also be small.

Figure 4:
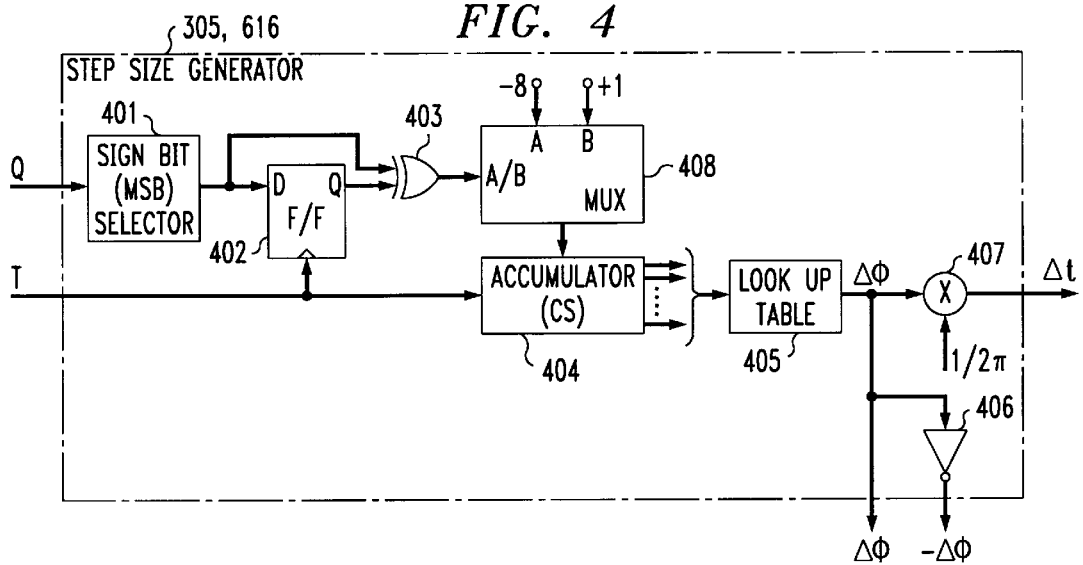
FIG. 4 shows in simplified form the step size generator employed in the VTF of FIG. 3.

FIG. 4 shows, in simplified block diagram form, details of step size generator 305 (616). As indicated above, Q is supplied to the step size generator and therein to sign bit (most significant bit) selector 401. The output of sign bit selector 401 is supplied to D-type flip-flop 402 which is employed to store it so that the Q output can be compared to the next received sign bit via exclusive OR gate 403. As is well known, if the next sign bit is different from the Q output of flip-flop 402, exclusive OR gate 403 will yield a logical 1 output and, if the Q output of flip-flop 402 is the same as the next sign bit, exclusive OR gate 403 will yield a logical 0 output. The output of exclusive OR gate 403 is supplied to the A/B select input of multiplexed (MUX) 408 to either select a first step size, for example, of −8, or a second step size, for example, of +1. Thus, when the output of exclusive OR gate is a logical 0, the +1 input to MUX 408 is selected to be supplied to accumulator 404 and, when the output of exclusive OR gate 403 is a logical 1, the −8 input is selected to be supplied to accumulator 404. Accumulator 404 is thus controlled by the output of MUX 408 to realize an adaptive rapid convergence to the desired values of $\Delta\phi$ and $\Delta t$, and once converged provides for a slower adaptation of those values. This is specifically shown in Table 1 below which indicates a plurality of step sizes from 0 through 255 at a step size of 16 for corresponding values of $\Delta\phi$ from $2^{-12}$ to $2^{-4}$ in one example. Table 1 is a look-up table which is stored in look-up table 405 to yield the desired value of $\Delta\phi$. In turn, the value of $\Delta\phi$ is supplied as an output and also is supplied to inverter 406 to yield a value of $\Delta\phi$ and to multiplier 407, where it is multiplied by $\frac{1}{2}\pi$ to yield the desired value of $\Delta t$. As indicated above, initially at start-up, the rotation is very rapid (in one example $\frac{1}{16}$ of a radian) and upon convergence the rotation becomes slow (i.e., the step size is small, for example $2^{-12}$).

TABLE 1

| | |
|---|---|
| 128–255 | $\Delta\phi = 2^{-4}$ |
| 112–127 | $\Delta\phi = 2^{-5}$ |
| 96–111 | $\Delta\phi = 2^{-6}$ |
| 80–95 | $\Delta\phi = 2^{-7}$ |
| 64–79 | $\Delta\phi = 2^{-8}$ |
| 48–63 | $\Delta\phi = 2^{-9}$ |
| 32–47 | $\Delta\phi = 2^{-10}$ |
| 16–31 | $\Delta\phi = 2^{-11}$ |
| 0–15 | $\Delta\phi = 2^{-12}$ |

Note that the step sizes are such as to bias accumulator 404 in the direction of going down and a number of steps must be taken in an upward direction in order to cross to a higher level in TABLE 1. Operation of accumulator 404 is such that after carrier is detected, in one example, accumulator 404 is loaded with a large number, for example, 255, which causes a fast mode of convergence because the angle of rotation of the vector is larger. In this example, by the time the $\Delta\phi = 2^{-6}$ level is reached in TABLE 1 the VTF is very quite. By way of example, going from 255 to 128 normally would take less than 100 symbols. Thereafter, it would be 4 symbols between $\Delta\phi$ values.

Figure 5:
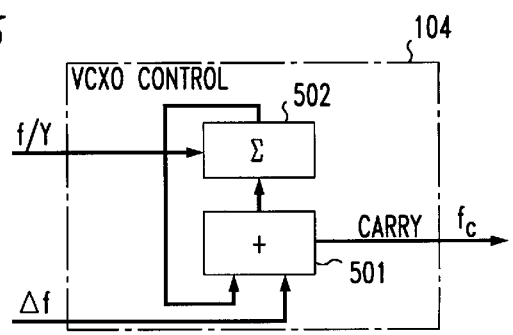
FIG. 5 shows in simplified block diagram form the VCXO control employed in FIG. 1.

FIG. 5 shows, in simplified block diagram form, details of VCXO control 104 of FIG. 1. Specifically, a representation of $\Delta f$ is supplied to summing unit 501 along with an output from accumulator 502. Additionally, f/Y is supplied to accumulator 502 which is a clock input for the purposes of updating accumulator 502. Summer 501 is responsive to the representation of $\Delta f$ and the output of accumulator 502 to yield carries. Thus, the output of VCXO control, namely $f_c$, is the control voltage for controlling voltage control crystal oscillator 105.

FIG. 6 shows, in simplified block diagram form, a multistage VTF that may also be employed in an embodiment of the invention. In this example, only two stages are shown although it would be apparent to those skilled in the art that other arrangements for rotating vectors will also track the desired phase value. Thus, shown in FIG. 6, are elements 601 through 622 for generating the desired value of $\Delta t$. It is noted that the two stages shown are essentially identical to the one stage VTF shown in FIG. 3 and will not be described again in detail. However, it is noted that in the two stage VTF only step size generator 616 is employed to yield $\Delta t$. Thus, outputs $Q_0$ and $P_0$ from the first stage are supplied to combiners 612 and 618, respectively.

What is claimed is:

1. A filter comprising:
    a complex filter being supplied values of a real part and an imaginary part of an estimated error vector related to a characteristic of the incoming data signal,
    the complex filter including an element for generating an average vector having a direction that is the average of the estimated error vector,
    a storage element for storing the average vector and
    an element for tracking a rotation in the estimated error vector and making a comparable rotation in the stored average vector,
    wherein the stored average vector increases so that a relatively long time constant can be used in the complex filter for long-term steady state operation and at the same time acquiring the steady state relatively rapidly.

2. The filter as defined in claim 1 wherein the element for tracking causes a relatively rapid convergence by rotating at a rapid rate and upon convergence rotating at a relatively slow rate.

3. The filter as defined in claim 1 wherein the tracking element includes a step size generator which is biased in a prescribed manner to achieve the rapid rotation during convergence and the slow rotation upon achieving convergence.

4. The filter as defined in claim 3 wherein the complex filter further includes elements for generating a filtered versions of the real part and the imaginary part of the estimated error vector, and wherein the step size generator is responsive to the filtered version of the imaginary part to generate a desired step size.

5. The filter as defined in claim 4 wherein the step size generator includes an accumulator which is controllably adjusted to realize an adaptive rapid convergence to the desired step size and once converged provides a slower adaptation of the step size.

\* \* \* \* \*